United States Patent [19]

Auzet et al.

[11] 4,264,884
[45] Apr. 28, 1981

[54] CHARGE TRANSFER FILTERING DEVICE

[75] Inventors: Christian Auzet; Jean-Edgar Picquendar, both of Paris, France

[73] Assignee: Thomson-CSF, Paris, France

[21] Appl. No.: 81,456

[22] Filed: Oct. 3, 1979

[30] Foreign Application Priority Data

Oct. 5, 1978 [FR] France ............................ 78 28518

[51] Int. Cl.³ .................. H03H 15/02; H03H 17/04; G11C 21/00
[52] U.S. Cl. ............................. 333/165; 307/221 D; 333/166
[58] Field of Search ................... 333/165, 166, 173; 307/295, 221 R, 221 C, 221 D, 304; 357/24; 328/167; 364/862

[56] References Cited

U.S. PATENT DOCUMENTS

| 4,100,513 | 7/1978 | Weckler | 307/221 D X |
| 4,145,675 | 3/1979 | Picquendar | 333/165 |

Primary Examiner—Marvin L. Nussbaum
Attorney, Agent, or Firm—Roland Plottel

[57] ABSTRACT

Charge transfer filtering device which comprises a recursive filter and a non-recursive filter. The two filters on separate semiconductor substrates have charge injection means 12, 10 receiving the input signal E for the non-recursive filter 2 and the output signal S, previously phase-displaced by 180° by means 9, for the recursive filter 1. Means 15, 16, common to both filters, ensure the reading and summation of the charge quantities weighted by means P and 14 and then the supply of the output signal S.

12 Claims, 7 Drawing Figures

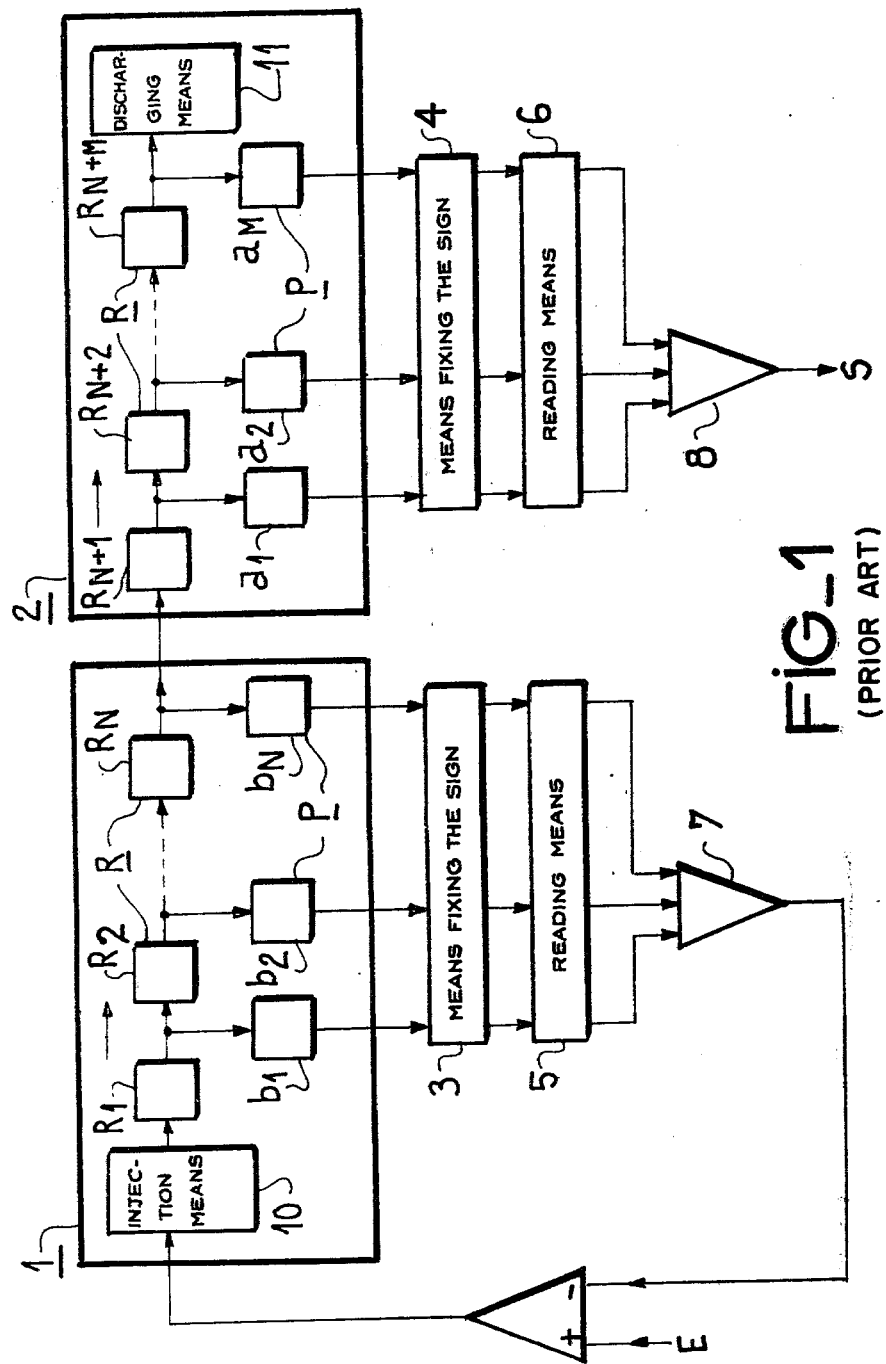
FIG_1 (PRIOR ART)

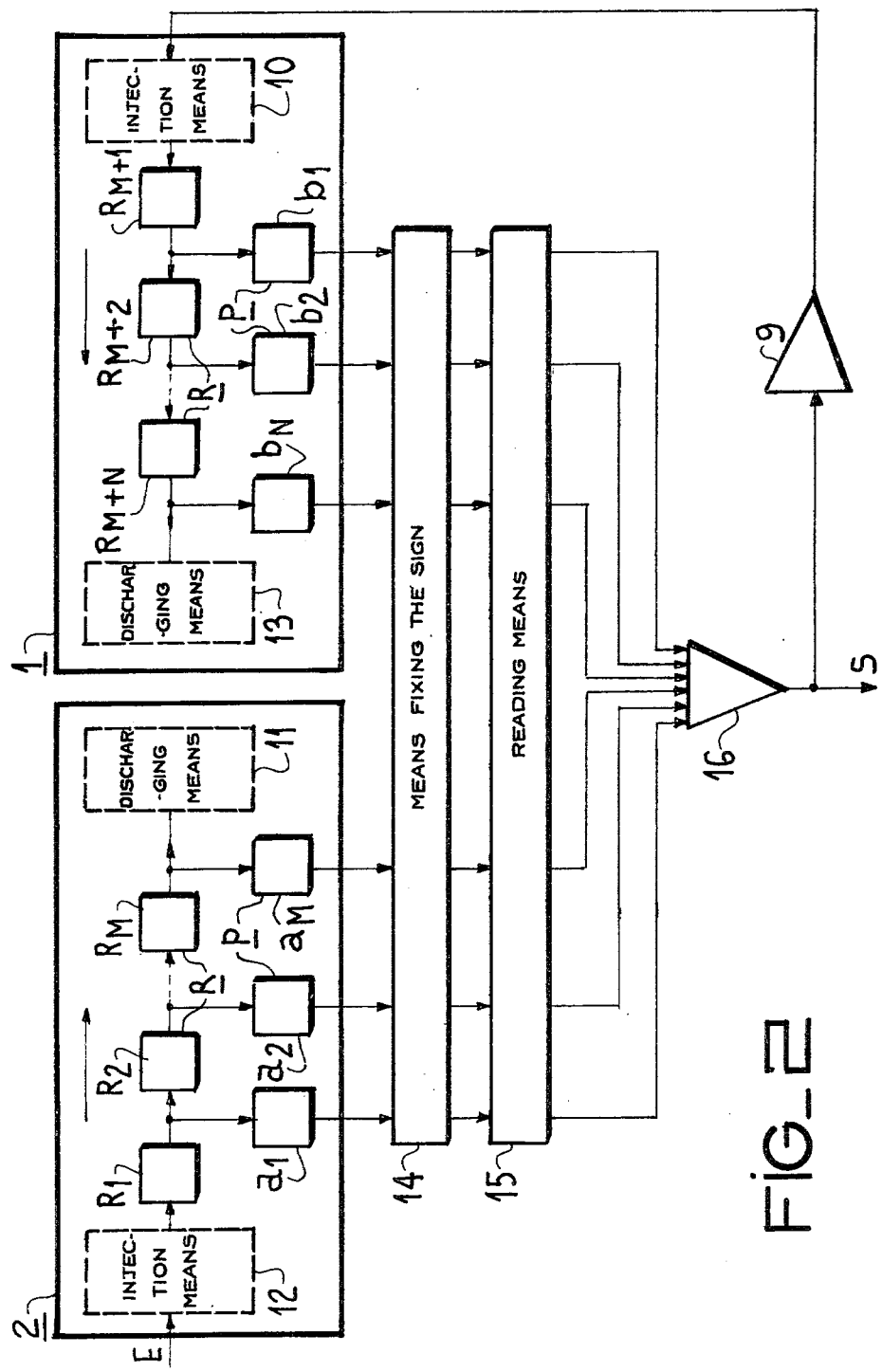
FIG_2

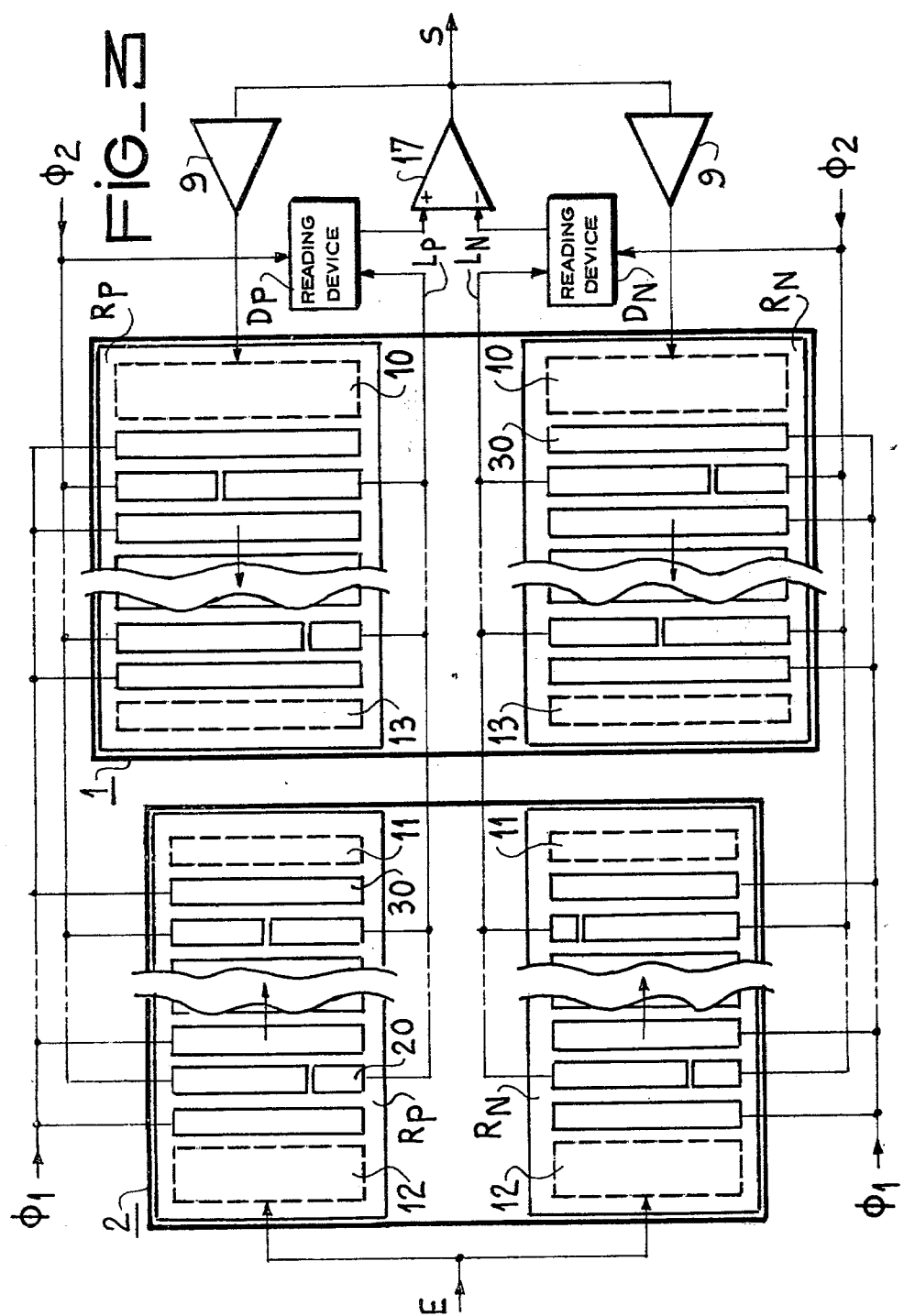

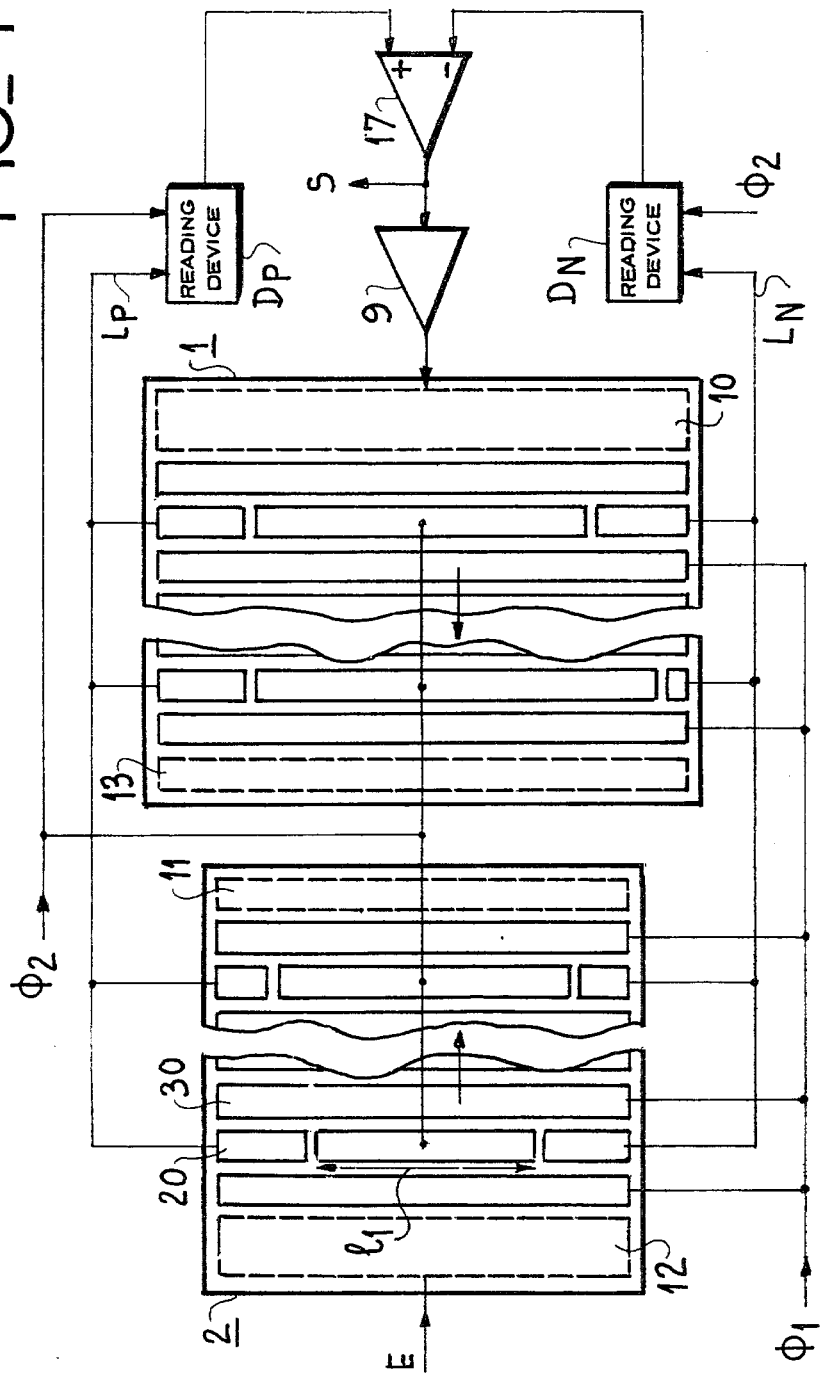

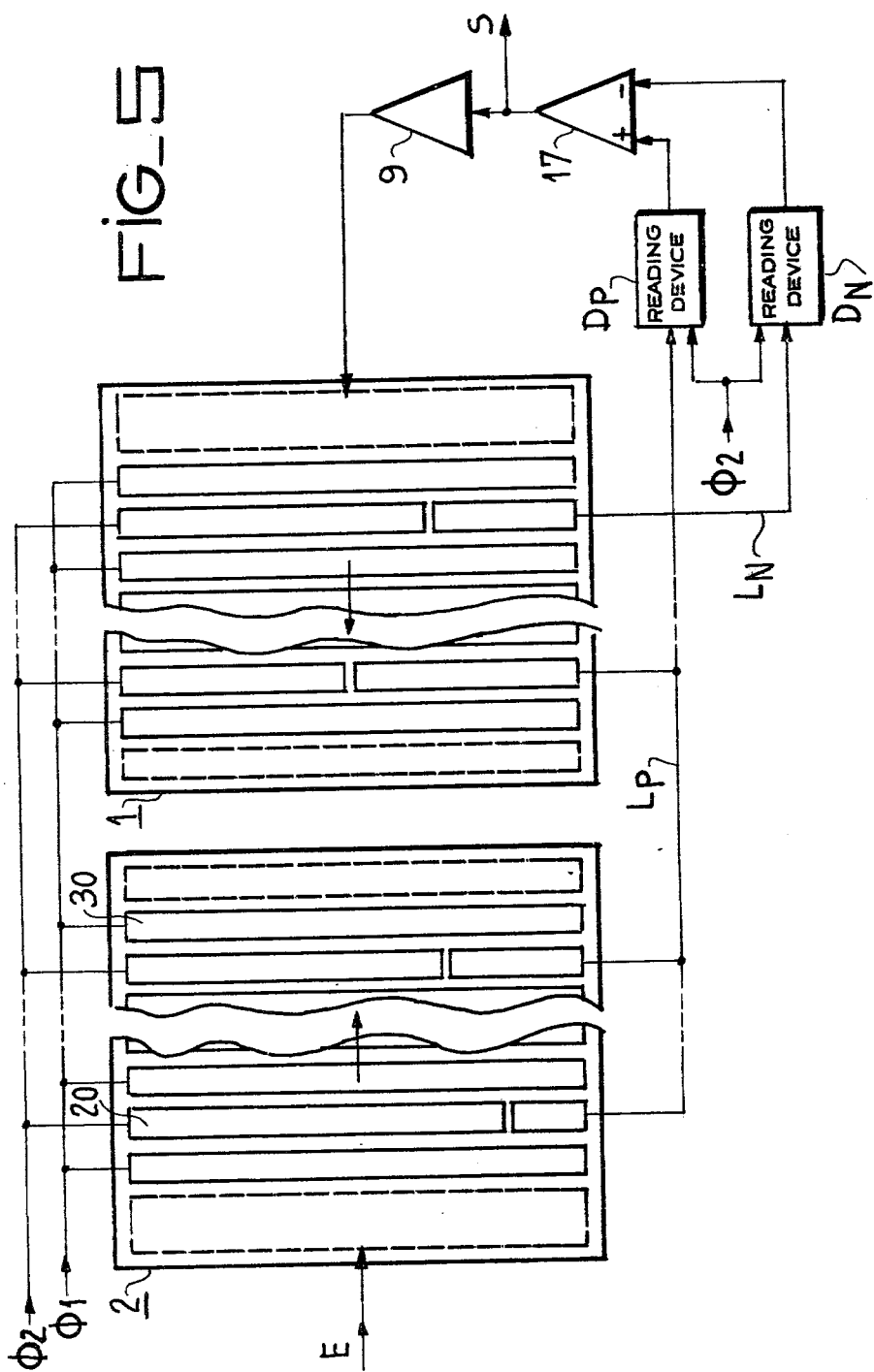

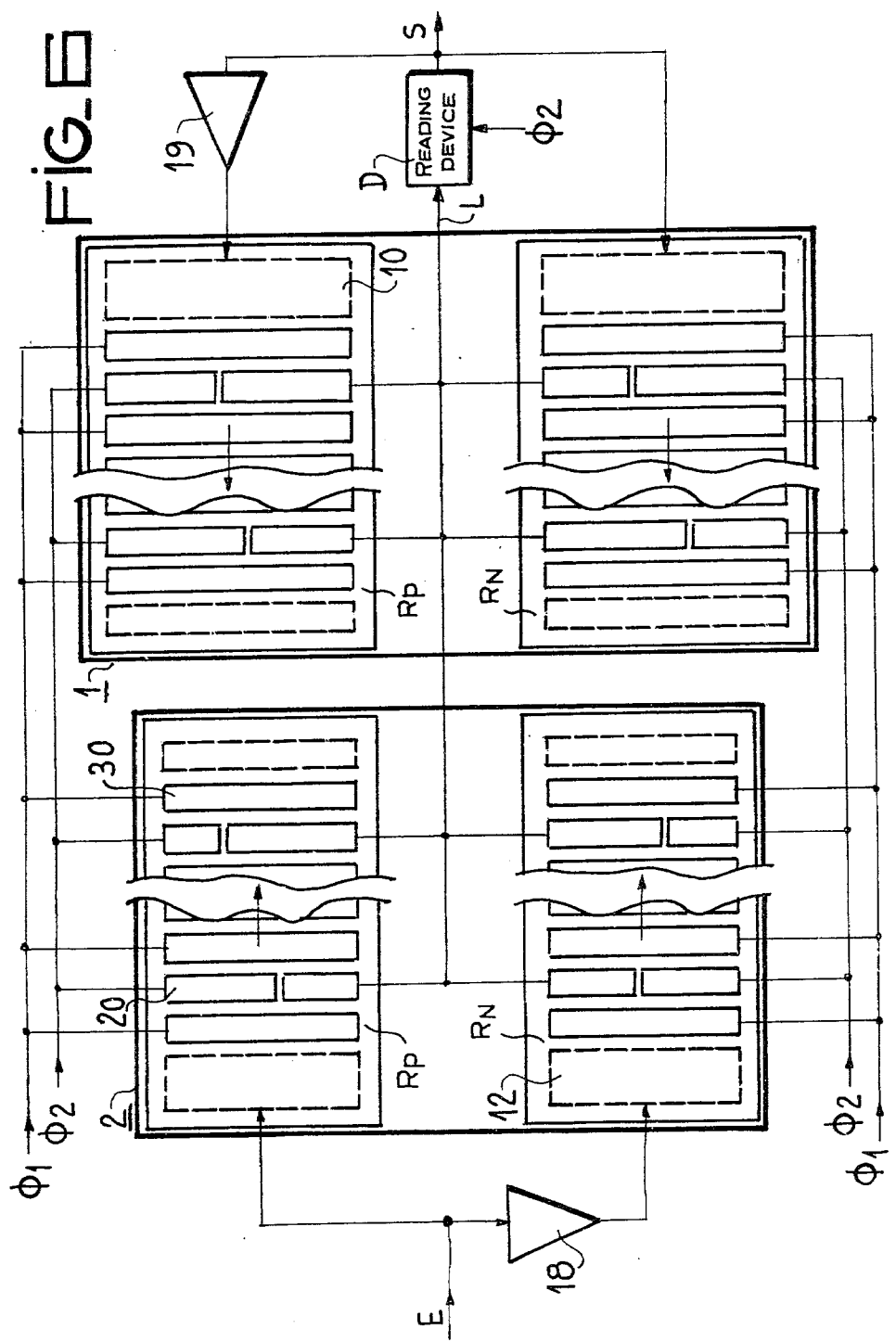

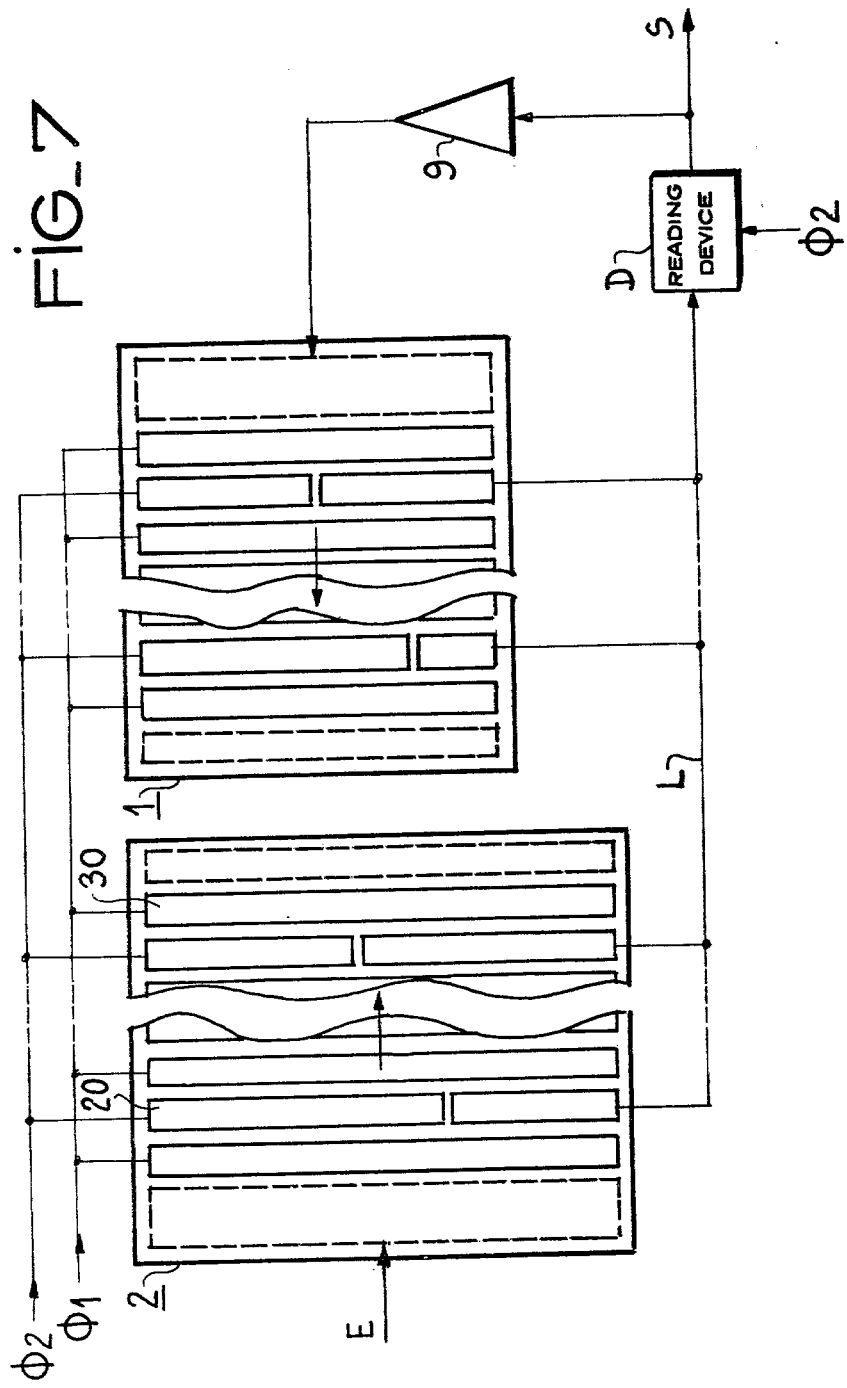

CHARGE TRANSFER FILTERING DEVICE

BACKGROUND OF THE INVENTION

The present invention relates to a filtering device using the transfer of electrical charges in semiconductor and having two electrical charge transfer filters, one being recursive and the other non-recursive.

An electrical charge transfer filter generally comprises:

a shift register for the transfer of electrical charges made on a semiconductor substrate covered by an insulating layer on which transfer electrodes are arranged parallel to one another and transversely with respect to the direction of the charges. For a periodic application of given potentials, these electrodes ensure the transfer into the substrate, from one register stage to the next, of groups of charges corresponding to samples of the input signal to be filtered;

weighting means connected to the output of the shift register stages which assign a weighting factor to the quantity of charges having passed through each stage.

The quantities of weighted charges are generally read differentially and this differential signal constitutes the electrical output signal of the filtering means.

In a recursive filter this signal is injected again at the input of the filter after having generally been phase-displaced by 180°.

In a non-recursive filter, there is no reinjection of the output signal at the filter input.

To bring about a given filtering in the case of a non-recursive filter, it is necessary to have a large number of weighting factors and therefore shift register stages and in the case of a recursive filter maximum accuracy in the values of the weighting factors which leads to construction problems.

Hybrid filtering devices for the transfer of electrical charges, i.e. having two electrical charge transfer filters, one recursive and the other non-recursive, have the advantage of reducing the number of weighting factors and the accuracy again required for the factor values for a given filtering operation.

Such filtering devices are known in the prior art where the two charge transfer registers belonging to two filters are arranged in series on the same semiconductor substrate. The connection between the two filters is made by charge transfer. Means belonging to each filter ensure the reading of quantities of weighted charges.

The first filter is recursive and the signal from its reading means is transmitted, after phase displacement, to means for the injection of charges located at the filter input, which also receives samples of the input signal.

The second filter is non-recursive and the signal from its reading means constitutes the output signal of the filtering means.

The disadvantage of such known hybrid devices is that it is necessary to have weighted charge quantity reading means for each filter. Devices for reading charges, in current or in voltage are known, in the prior art. The disadvantages of these devices in their complexity and overall dimensions, which are greater than those of the charge injection means.

BRIEF SUMMARY OF THE INVENTION

The present invention relates to a filtering device for the transfer of electrical charges which comprises: two transfer filers, each filter having at least one charge transfer shift register. Each register is produced on a separate semiconductor substrate and has an insulating layer deposited on the substrate and transfer electrodes arranged parallel to one another and transversely with respect to the charge transfer direction. The transfer electrodes ensure the transfer of charges into the substrate between successive register stages in the case of periodic application of given potential. The first non-recursive filter has on each register means for the injection of charges corresponding to samples of the electrical input signal to be filtered E. The second recursive filter has on each register means for injecting charges corresponding to the electrical output signal S, previously phase-displaced by 180° by phase displacement means. Each filter also has weighting means connected to the output of the stages of each shift register allocating a weighting factor to the quantity of charges having passed through each stage and means for the discharge of charges having passed through the final stage of the shift register.

means fixing the sign of the weighting factors.

means common to both filters for the algebraic summation of the weighted charge quantities and for reading the electrical charge quantities, said means supplying the electrical charge signal S of the filter device.

The hybrid filtering device according to the invention has numerous advantages compared with the per se known means. The surface area of the semiconductor substrate necessary for producing the filtering means is reduced, so that there is also a reduction in the overall dimensions and cost of the device. This reduction is due to the use of means for reading the weighted charge quantities common to both filters and to the construction of the filters and each register on a separate semiconductor substrate. The non-recursive filter and the recursive filter correspond to the numerator and the denominator of the transfer function of the filtering device. As each filter is on a separate substrate, to obtain a given filtering it is easily possible to modify its construction in order to adapt it to the sought result for the numerator and the denominator of the transfer function. Thus, the necessary substrate surface area is reduced.

In one of the embodiments of the filtering device, at least one of the filters can have two shift registers assigned to the processing of weighting factors having the same sign. In this case, it is possible to adapt the dimensions of each register to the sough result. The device according to the invention has a reduced average group propagation time, a reduced noise and sensitivity to noise.

A special case with respect to the means according to the invention occurs when all the weighting factors are positive. In this case, the invention leads to better filtering performances with regard to the linearity of transfer, the noise produced by the filtering device and the dynamics obtained for a given harmonic content.

BRIEF DESCRIPTION OF THE DRAWINGS

The invention will be described in greater detail hereinafter relative to non-limitative embodiments of the invention, with reference to the attached drawings, wherein show:

FIGS. 1 and 2 respectively a basic circuit for a charge transfer hybrid filtering device according to the prior art and according to the invention.

FIGS. 3 to 7 various embodiments of the filtering device according to the invention.

DETAILED DESCRIPTION OF THE PREFERRED EMBODIMENTS

In the drawings, the same reference numerals designate the same components and for reasons of clarity the dimensions and proportions of the various components have not been respected.

FIG. 1 is a basic circuit diagram of the charge transfer hybrid filtering device according to the prior art. In FIG. 1, where symbolic representations are used, the recursive filter 1 is in series with the non-recursive filter 2, the two filters being on the same semiconductor substrate. Each filter has a shift register R having N stages $R_1$ to $R_N$ for the recursive filter and M stages $R_{N+1}$ to $R_{N+M}$ for the non-recursive filter. The connection between the two filters is obtained by the transfer of charges, arrows indicating the transfer direction. Weighting means P are connected to the output of the stages of each register and allocated a weighting factor $b_1$ to $b_N$ for the recursive filter and $a_1$ to $a_M$ for the non-recursive filter to the quantity of charges having passed through each stage. Means inherent in each filter fix the sign of the weighting coefficients 3 and 4, ensure the reading of the electrical charge quantities 5 and 6 and the algebraic summation of the weighted charge quantities 7 and 8. The signal from the summation means 7 of the recursive filter is transmitted, after 180° phase displacement, to the means for the injection of charges 10 located at the input of the filter, which also receives samples of electrical input signal E, a differential amplifier can be used.

The signal from the summation means 8 of the non-recursive filter constitutes the electrical output signal S of the filtering means. This filter also has means 11 for the discharge of charges having traversed the stage $R_{N+M}$.

FIG. 2 is a basic circuit diagram of the charge transfer hybrid filtering device according to the invention. In FIG. 2, where symbolic representations are used, the recursive filter 1 and the non-recursive filter 2 have in each case a shift register R with M stages $R_1$ to $R_M$ for the non-recursive filter and N stages $R_{M+1}$ to $R_{M+N}$ for the recursive filter and produced on a separate semiconductor substrate. The non-recursive filter has means 12 for the injection of charges corresponding to the samples of the electrical input signal E and the recursive filter has means 10 for the injection of charges corresponding to the electrical output signal S, previously phase-displaced by 180° by means 9. Each filter also has means 11 and 13 for the discharge of charges having passed through the final stage of the registers. Means 14 fix the sign of the weighting factors. Finally, means which are common to both filters ensure the reading of the electrical charge quantities 15 and the algebraic summation of the weighting charge quantities 16. These means supply the electrical output signal S of the filtering device.

The transform in z of the transfer function of the means according to the invention is written:

$$F_1 = \frac{S(z)}{E(z)} = \frac{\sum_{k=1}^{M} a_k z^k}{1 + \sum_{k=1}^{N} b_k z^k}$$

with $z = e^{2\pi j f T}$ f being the frequency of the input signal E and T the clock time of the shift registers.

If $F_2$ is the transform in z of the transfer function of the means of FIG. 1, we obtain $$F_2 = z^n \cdot F_1$$

Thus, the device according to FIG. 1 compared with the device according to the invention introduces a constant delay with frequency which is equal to N clock times T.

Thus, the device according to the invention makes it possible to improve the propagation time of the average filter group without changing the attenuation curve as a function of frequency.

The transfer function $F_1$ of the device according to the invention can be written:

$$F_1 = G \cdot \frac{\sum_{k=1}^{M} A_k z^k}{\sum_{k=0}^{N} B_k z^k}$$

The factors $A_k$ and $B_k$ are standardised so that the gain in the transfer function provides G at a given frequency $f_o$. The factors $a_k$ and $b_k$ can be calculated as a function of the factors $A_k$ and $B_k$, the value G and a constant $\alpha$.

FIGS. 3 to 7 show various embodiments of the device according to the invention.

The weighting means P of the charge quantities can be constituted by resistance bridges. They may also be constituted by weighting electrodes interconnected with transfer electrodes on each register. Each weighting electrode is divided into at least two elementary electrodes separated in accordance with the charge transfer direction by an interruption and a quantity of weighted charges can be collected beneath each elementary electrode. The transfer and weighting electrodes ensure the transfer of charges into the substrate in the case of periodic application of given potentials.

In FIGS. 3 to 7, the weighting means are constituted by weighting electrodes 20 interconnected with transfer electrodes 30, each periodically receiving a potential $\phi 1$ ensuring the transfer of charges into the substrate.

In FIG. 3, each filter has two shift registers $R_p$ and $R_N$. Each register processes weighting factors of the same sign, positive for $R_p$ and negative for $R_N$.

Each weighting electrode of the two registers 20 is divided into two elementary electrodes. A quantity of weighted charges is connected beneath one of the elementary electrodes of the weighting electrodes of the two registers by two collecting lines $L_p$ and $L_N$ receiving weighted charge quantities from one register of each filter.

In FIG. 3 as in FIGS. 4 and 5 described hereinafter, the two collecting lines $L_p$ and $L_N$ receive from each filter weighted charge quantities assigned a weighting factor of the same sign, said lines being coupled to two devices for reading charges in current or in voltage $D_p$ and $D_N$. Moreover, for these three embodiments, means fixing the sign of the weighting factors and the algebraic summation means for the weighted charge quantities have a differential amplifier 17 of unit gain receiving at its inputs the signals from the reading devices.

In FIG. 3, device $D_p$ is connected to the positive input and device $D_N$ to the negative input of the differential amplifier. Each elementary electrode of the registers, beneath which charges are not connected for reading purposes, periodically receives a given potential $\phi_2$ ensuring the transfer of charges into the substrate. The potential $\phi_2$ is also applied to other elementary electrodes, e.g. via reading devices.

In FIG. 4, each filter has single register. Each weighting electrode 20 of the registers is divided into three elementary electrodes. A quantity of weighted charges is collected on two of three elementary electrodes of each weighting electrode by two collecting lines $L_p$ and $L_N$. The elementary electrode of each weighting electrode beneath which the charges are not collected is positioned, in the drawing, between two elementary electrodes beneath which the charges are connected in order to permit an easier extraction of weighted charge quantities. It is obvious that the respective positions of the three elementary electrodes can be changed.

As compared with the embodimdent of FIG. 3, the embodiment of FIG. 4 makes it possible to reduce the surface area of the semiconductor used by reducing the number of registers. This reduction increases in inverse proportion to the weighted width $l_1$ of the elementary electrode beneath which the charges are not collected. It is then possible to provide a broken line for connecting the elementary electrodes beneath which the charges are not collected to the potential $\phi_2$. In FIG. 5, each filter only has one shift register. Each weighting electrode 20 is subdivided into two elementary electrodes. A quantity of weighted charges is connected beneath one of the elementary electrodes by one or other of the two collecting lines $L_p$ and $L_N$.

The device of FIG. 5 can only be used under certain conditions. Thus, so that the transfer of charges is not disturbed by "edge effects" the dimension of an elementary electrode, in the direction perpendicular to that of the charge transfer or width must not be less than a limit value d. In the device of FIGS. 3 and 4 where the same number of factors of each sign is processed (whereby certain of these can be zero) a width $d+x$ can be given to each elementary electrode, the value x varying as a function of the weighting factor to be obtained. In the device of FIG. 5 where the number of factors with each sign varies with the transfer function to be obtained, this is no longer possible.

Thus, the embodiment of FIG. 5 can only be used if the "edge effects" are ignored or if the weighting factors have sufficiently high values and it is necessary to have:

$$\begin{cases} \text{Min} & |B_k| \geq \frac{d}{l} B_o \\ k = 1 \ldots N \\ G \cdot \text{Min} & |A_k| \geq \frac{d}{l} B_o \\ k = 1 \ldots M \end{cases} \quad (1)$$

in which l represents the sum of the widths of the elementary electrodes beneath which the charges are collected for a given gain of the whole filtering device.

This embodiment makes it possible to reduce the stray capacities produced by the elementary electrodes on the charge reading devices.

In FIGS. 3 to 5, the collection lines $L_p$ to $L_N$ can also receive from each filter quantities of weighted charges having weighting coefficients of different sign, whereby the sign is the same as the differential amplifier input connected to the reading device coupled to the line in the case of the recursive filter, whilst the opposite sign is obtained for the non-recursive filter.

This embodiment has the advantage of reducing the number of inverters necessary for looping the recursive filter and in particular makes it possible, in certain cases, to distribute the stray capacities produced on the reading devices by the elementary electrodes when there is an unbalance between the positive and negative weighting factor values.

FIGS. 6 and 7 show two other embodiments of the filtering device according to the invention in which the means for the algebraic summation of the weighted charge quantities are constituted by a single collecting line L receiving the weighted charges from two filters.

In FIG. 6, each filter has two registers $R_p$ and $R_N$. Each weighting electrode 20 is divided up into two elementary electrodes. A quantity of weighted charges is collected beneath one of the elementary electrodes of each weighting electrode by the collecting line L. The means fixing the sign of the weighting factors are constituted by two inverters 18 and 19. Inverter 18 inverts the samples of the electrical input signal E to be filtered before they are applied to the means for the injection of charges 12 of register $R_N$, thus allocated to the processing of negative weighting factors from the non-recursive filter 2.

Inverter 19 inverts the electrical output signal S before it is applied to the means for injecting the charges 10 of register $R_p$, thus allocated to the processing of the positive weighting factors from the recursive filter. The reading means are constituted by a charge reading device D coupled to the collecting line L and supplying the output signal S of the means.

In FIG. 7, each filter has one register. Each weighting electrode 20 is divided up itself into two elementary electrodes. A weighted charge quantity is collected beneath one of the elementary electrodes of each weighting electrode by the collecting line L. The means for reading the quantities of electrical charges and the means fixing the sign of the weighting factors are constituted by a charge reading device D, with a single input and which does not bring about a phase displacement, coupled to the collecting line and supplying the electrical output signal S of the means.

In FIG. 7, as in FIG. 6, each elementary electrode beneath which charges are not collected for reading purposes, periodically receives a given potential $\phi_2$ ensuring the transfer of charges into the substrate. This potential $\phi_2$ is also applied to the other elementary electrodes, for example via the reading device.

In FIG. 7, all the weighting factors of the two filters are positive. This embodiment is particularly so simple and leads to better filtering performance with regard to the linearity of transfer, the noise produced by the device and the dynamics obtained for a given harmonic content. Another advantage of the embodiment of FIG. 7 is that, like FIG. 6, it does not have a differential amplifier, which is always difficult to integrate. Like the embodiment of FIG. 5, that of FIG. 7 can only be used if the "edge effects" are ignored, or if the weighting factors have sufficiently high values. The relationship 1 must be checked.

The two filters 1 and 2 of the filtering device are constructed in the same way in all the embodiments shown in the drawings. However, it is obvious that the invention relates to filtering devices, whereof at least one of the filters has the filter construction shown in FIGS. 3 to 5. The invention also relates to devices, whereof one of the filters has positive weighting factors and a construction identical to that of the filters of FIG. 7 and whereof the other filter permits the processing of positive and negative factors and requires two collecting lines $L_p$ and $L_N$, two reading devices $D_p$ and $D_N$ and a differential amplifier 17. The collecting line of the filter with positive factors is then coupled to the reading device connected to the positive input of the differential amplifier.

Any filtering device differing from those described hereinbefore with regard to the number of phases of the shift registers, the number and position of the 180° phase-displacement means 9, which can be modified without changing the result, do not pass beyond the scope of the invention.

The device according to the invention can be preceded by a prefiltering device which makes it possible to select the frequency band containing the sought transfer function, because the device according to the invention has a periodic frequency response. Prefiltering devices are known, for example from the article "Antialiasing inputs for charge coupled devices" by Carlo H. SEQUIN, published in the American Journal "IEEE Journal of Solid-State Circuits", Volume SC 12, No. 6, Dec. 1977, pp. 609 to 616. In connection with FIG. 2, this device can be placed between the charge injection device 12 of the non-recursive filter 2 and the first stage $R_1$ of the shift register.

What is claimed is:

1. A charge transfer filtering device which comprises: a first and a second charge transfer filters, each filter having at least one charge transfer shift register being realized on a separate semiconductor substrate and having an insulating layer deposited on the substrate and transfer electrodes arranged parallel to one another and transversely with respect to the charge transfer direction, these electrodes ensuring the transfer of charges into the substrate from one stage of the register into the next in the case of a periodic application of given potentials, the first filter which is non-recursive having on each register means for the injection of charges corresponding to samples of the electrical input signal to be filtered, the filter which is recursive having on each register means for the injection of charges corresponding to the electrical output signal of the device, previously phase-displaced by 180° by phase-displacement means, each filter also having weighting means connected to the output of the stages of each shift register which assign a weighting factor to the quantity of charges having passed through each stage and means for the discharge of charges having passed through the final stage of the shift register;
means fixing the sign of the weighting factors;
means common to both filters for the algebraic summation of the weighted charge quantities and for reading the electrical charge quantities, said means supplying the electrical output signal of the filtering means.

2. A filtering device according to claim 1, wherein the weighting means are constituted by weighting electrodes interconnected on each register with the transfer electrodes, each weighting electrode being divided up into at least two separate elementary electrodes according to the charge transfer direction by an interruption, whereby a quantity of weighted charges can be collected beneath each elementary electrode, the transfer and weighting electrodes ensuring the transfer of charges into the substrate in the case of periodic applications of given potentials.

3. A filter device according to claim 2, wherein the reading means are constituted by two devices for reading the charges in current or in voltage coupled to two collecting lines for the weighted charge quantities of the two filters and wherein the means fixing the sign of the weighting factors and the algebraic summation means for the weighted charge quantities have a differential amplifier of unit gain receiving the signals from the charge reading devices.

4. A filtering device according to claim 3, wherein the two collecting lines receive weighted charge quantities from each filter and which are to be assigned a weighting factor of the same sign by the sign fixing means.

5. A filtering means according to claim 3, wherein the two collecting lines receive from each filter weighted charge quantities which are to be assigned weighting factors of different sign, of the same sign as the differential amplifier input connected to the reading device coupled to the collecting line in the case of the recursive filter and of opposite sign for the non-recursive filter.

6. A filter device according to claim 3, wherein at least one of the two filters of the device has two charge transfer shift registers and wherein each weighting electrode of the two registers is subdivided into two elementary electrodes, a quantity of weighted charges being collected beneath one of the elementary electrodes of the weighting electrodes of the two registers by two collecting lines, each line receiving weighted charge quantities from one register.

7. A filtering device according to claim 3 wherein at least one of the two filters of the device has a single charge transfer shift register and wherein each weighting electrode of the register is subdivided into three elementary electrodes and a quantity of weighted charges is collected beneath two of the three elementary electrodes of each weighting electrode of the register by two collecting lines.

8. A filtering device according to claim 3, wherein at least one of the two filters of the device has a single charge transfer shift register and wherein each weighting electrode of the register is subdivided into two elementary electrodes and a quantity of weighted charges is collected beneath one of the elementary electrodes of each weighting electrode by one or other of the two collecting lines.

9. A filtering device according to claim 3, wherein on the filters with positive weighting factors has a single charge transfer shift register and wherein each weighting electrode is subdivided into two elementary electrodes and a weighted charge quantity is collected beneath one of the elementary electrodes of each weighting electrode by the same collecting line coupled to the charge reading device connected to the positive input of the differential amplifier, the other filter of the device permitting the processing of positive and negative weighting factors and using the two charge collecting lines, two charge reading devices and two inputs of the differential amplifier.

10. A filtering device according to claim 2, wherein the means for the algebraic summation of the weighted charge quantities are constituted by a collecting line for the weighted charges of the two filters.

11. A filtering device according to claim 10, wherein each of the two filters has two charge transfer shift registers and wherein each weighting electrodes of the filters is divided up into two elementary electrodes and a quantity of weighted charges is collected beneath one of the elementary electrodes of each weighting electrode of the registers by the collecting line, the means fixing the sign of the weighting factors being constituted by two inverters inverting on the one hand the samples of the electrical input signal to be filtered before they are applied to the charge injection means of one of the shift registers, thus allocated to the processing of negative weighting factors, of the non-recursive filter and inverting on the other hand the electrical output signal before it is applied to the charge injection means of one of the shift registers, thus allocated to the processing of positive weighting factors, of the recursive filter, the means for reading the electrical charge quantities being constituted by a reading device of the charges in current or in voltage coupled to the collecting lines and supplying the electrical ouput signal of the device.

12. A filtering device according to claim 10, wherein the two filters have positive weighting factors and a single charge transfer shift register and wherein each weighting electrode is subdivided into two elementary electrodes and a weighted charge quantity is collected beneath one of the elementary electrodes of each weighting electrode by the collecting line, the means for reading the electrical charge quantities and means fixing the sign of the weighting factors being constituted by a reading device of the charges in current or in voltage with a single output and which does not bring about a phase displacement, coupled to the collecting line and supplying the electrical output signal of the means.

* * * * *